United States Patent [19]
Matsumoto

[11] Patent Number: 5,598,023
[45] Date of Patent: Jan. 28, 1997

[54] PHOTOELECTRIC CONVERTING APPARATUS

[75] Inventor: Shigeyuki Matsumoto, Atsugi, Japan

[73] Assignee: Canon Kabushiki Kaisha, Tokyo, Japan

[21] Appl. No.: 339,749

[22] Filed: Nov. 15, 1994

Related U.S. Application Data

[63] Continuation of Ser. No. 44,898, Apr. 7, 1993, abandoned, which is a continuation of Ser. No. 630,762, Dec. 21, 1990, abandoned, which is a continuation of Ser. No. 242,146, Sep. 9, 1988, abandoned.

[30] Foreign Application Priority Data

Sep. 11, 1987 [JP] Japan ................................. 62-226711

[51] Int. Cl.$^6$ ........................... H01L 31/11; H01L 27/142
[52] U.S. Cl. ........................ 257/462; 257/291; 257/443
[58] Field of Search .......................... 357/30, 34, 43; 257/291, 462, 443

[56] References Cited

U.S. PATENT DOCUMENTS

| | | | |
|---|---|---|---|
| 4,047,217 | 9/1977 | McCaffrey | 357/34 |
| 4,649,409 | 3/1987 | Rappongi et al. | 357/30 |
| 4,794,443 | 12/1988 | Tanaka et al. | 357/30 |
| 4,800,171 | 1/1989 | Iranmanesh et al. | 357/34 |
| 4,825,274 | 4/1989 | Higuchi et al. | 357/43 |
| 5,126,814 | 6/1992 | Nakamura | 257/83 |

*Primary Examiner*—Jerome Jackson
*Attorney, Agent, or Firm*—Fitzpatrick, Cella, Harper & Scinto

[57] ABSTRACT

A photoelectric converting apparatus has a semiconductor transistor for accumulating carriers generated by a light excitation into a control electrode region. A portion in the control electrode region other than at least a portion which contributes to an operation of the transistor has impurity concentrations higher than an impurity concentration of the portion which contributes to the transistor operation.

25 Claims, 4 Drawing Sheets

PHOTOELECTRIC CONVERTING APPARATUS

This application is a continuation of application Ser. No. 08/044,898 filed Apr. 7, 1993, now abandoned, which was a continuation of application Ser. No. 07/630,762, filed Dec. 21, 1990, now abandoned, which was a continuation of application Ser. No. 07/242,146, filed Sep. 9, 1988, now abandoned.

BACKGROUND OF THE INVENTION

1. Field of the Invention

The present invention relates to a photoelectric converting apparatus having a semiconductor transistor for accumulating carriers generated by light excitation into a control electrode region.

2. Related Background Art

FIG. 1A is a schematic cross-sectional view of a photoelectric converting apparatus as disclosed in European Patent Application Laid-Open No. 0201270. FIG. 1B is an equivalent circuit diagram of this apparatus.

In the diagrams, each photosensor cell is electrically separated from the adjacent photosensor cell by an $n^+$ element separating region 6.

Each photosensor cell has the following structure.

An $n^-$ region 4 of a low n-type impurity concentration is formed by an epitaxial technique or the like. A p base region 9 is then formed in the $n^-$ region 4 by doping impurities of the p-type. An $n^+$ emitter region 15 is formed in the p base region 9 by doping n type impurity at a high concentration according to an impurity diffusion technique, ion implantation technique, or the like. That is, a bipolar transistor of npn type is formed.

A polysilicon layer 14 having a predetermined area is formed over the $n^-$ region 4 through an oxide film 12. The polysilicon region 14 faces the p base region 9 through the oxide film 12. The polysilicon region 14, the oxide film 12 and the p base region 9 construct a capacitor $C_{ox}$ to control the potential of the p base region 9.

In addition, an emitter electrode 19, a capacitor electrode 17 electrically connected to the polysilicon region 14, an $n^+$ region 2 having a high impurity concentration on the back surface of the n type silicon substrate 1, a collector electrode 21, and the like are formed, respectively.

The fundamental operation of the photoelectric converting device as shown in FIGS. 1A and 1B will now be described. The light enters and is absorbed by the p base region 9 of the bipolar transistor. The charges (holes in this case) corresponding to the incident light amount are accumulated in the p base region 9. The voltage of p base region 9 (base potential) changes in accordance with the charges accumulated (accumulating operation).

Next, the base potential is increased by applying a positive voltage to the capacitor electrode 17. The p base region 9 is forwardly biased for the $n^+$ emitter region 15. The voltage of the p base region 9 is read out of the emitter electrode 19 which is in the floating state by the operation of the transistor which is executed by the forward biasing operation. Thus, an electric signal corresponding to the incident light quantity can be derived (reading operation).

By connecting emitter electrode 19 to the ground potential and then applying a pulse of a positive voltage to the capacitor electrode 17, the charges accumulated to the p base region 9 are eliminated. Thus, the p base region 9 is forwardly biased for the $n^+$ emitter region 15 and the accumulated charges are eliminated (refreshing operation). Thereafter, the accumulating, reading, and refreshing operations are repeated.

The capacitor $C_{ox}$ may be omitted in some instances.

In the foregoing photoelectric converting apparatus, it is desirable that a current amplification factor, $H_{fe}$, under the emitter grounded condition is as high as possible in order to raise the driving capability, to accomplish the high reading speed and to reduce the breakdown of the holes in the p base region during the reading operation. To maintain an insulating breakdown voltage and to assure the high $H_{fe}$, the impurity concentration of the p base region 9 needs to be suppressed as low as about a value within a range from $1 \times 10^{15}$ to $5 \times 10^{17}$ cm$^{-3}$.

However, the reduction of the impurity concentration of p base region 9 causes the following problems.

(1) The impurity concentration at the interface between the p base region 9 and the oxide film 12 is further decreased due to the segregation. Additionally, as a result, in a device having this construction a surface generating current $I_{surf}$ is generated, causing a large noise component.

(2) When a pulse of a positive voltage is applied to the capacitor electrode 17, the polarity of the p base region 9 just under the polysilicon region 14 is inverted into the n type and a capacitance value of the capacitor $C_{ox}$ decreases, so that the output decreases.

(3) When a surface current is generated at the interface between the p base region 9 and the oxide film 12, a channel is formed on the surface of the p base region 9, so that punchthrough easily occurs on the surface between the collector and the emitter.

SUMMARY OF THE INVENTION

An object of the present invention is to provide an photoelectric conversion apparatus, wherein the impurity concentration of the portion which contributes to the transistor operation of the control electrode region is suppressed to a low value and the impurity concentrations of the other portions are set to high values. Therefore, the high $H_{fe}$ is derived and the noise component due to the surface current can be reduced and the high withstanding voltage of the transistor can be assured.

To solve the above problems, an embodiment of the present invention provides a photoelectric converting apparatus having a semiconductor transistor for accumulating carriers generated by the light excitation into a control electrode region, wherein a portion in the control electrode region, other than at least the portion which contributes to the operation of the transistor has higher impurity concentrations than that of the portion which contributes to the operation of the transistor.

Another embodiment provides a photoelectric converting apparatus comprising an n-type semiconductor substrate, and a p-type base region and an $n^+$ emitter region formed by doping inpurities into the substrate, thereby a carrier generated by photo-excitation can be accumulated into the p base region, wherein the p base region has a low concentration region of low impurity concentration and a high concentration region of high impurity concentration, the low concentration region being provided between said n-type semiconductor substrate and said $n^+$ emitter region.

Still another embodiment provides a photoelectric converting apparatus comprising a first semiconductor region of first conductivity type, a second semiconductor of the first conductivity type, a third semiconductor region of a conductivity type opposite to the first conductivity type operatively associated to the first and second semiconductor regions so that photo-excited carriers can be accumulated into the third semiconductor region, and a fourth semiconductor region provided between the first and second semiconductor regions, and doped with impurities at a concentration lower than that of the third semiconductor region.

According to a photoelectric converting apparatus of the invention, the impurity concentration of the portion which contributes to the transistor operation in the control electrode region is reduced to a low value and those of the other portions are set to high concentrations. Therefore, the high $H_{fe}$ is obtained and the noise component due to the surface current can be reduced. Further, a high breakdown voltage of the transistor can be assured.

For example, the impurity concentration of the portion which contributes to the transistor operation in the control electrode region is set to a value within a range from $1\times10^{15}$ to $5\times10^{17}$ cm$^{-3}$, and the impurity concentrations of the other portions are set to values within a range from $1\times10^{17}$ to $5\times10^{19}$ cm$^{-3}$.

DETAILED DESCRIPTION OF THE PREFERRED EMBODIMENTS

Embodiments of the present invention will be described in detail hereinbelow with reference to the drawings.

Figure 1A:
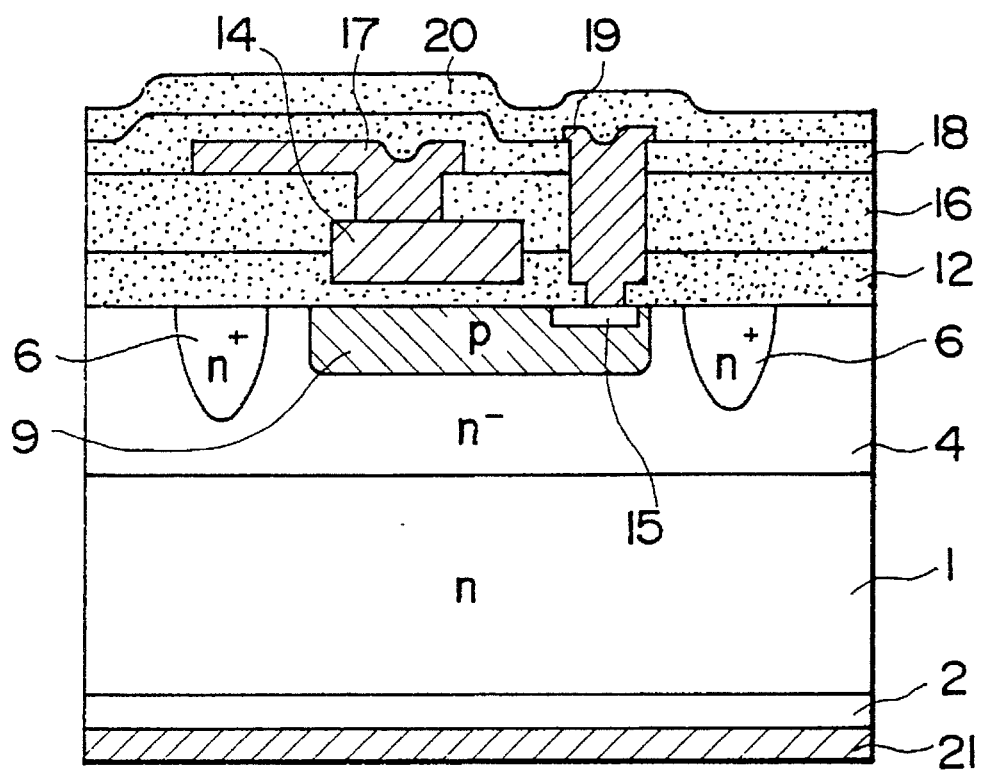
FIG. 1A is a schematic cross-sectional view of a conventional photoelectric converting apparatus.
Figure 1B:
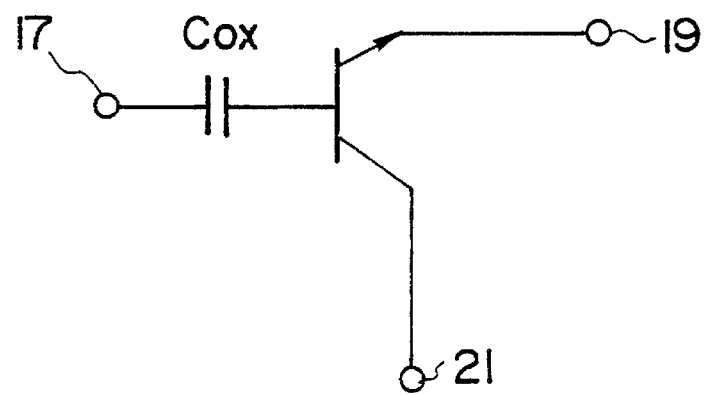
FIG. 1B is an equivalent circuit diagram of that apparatus.
Figure 2A:
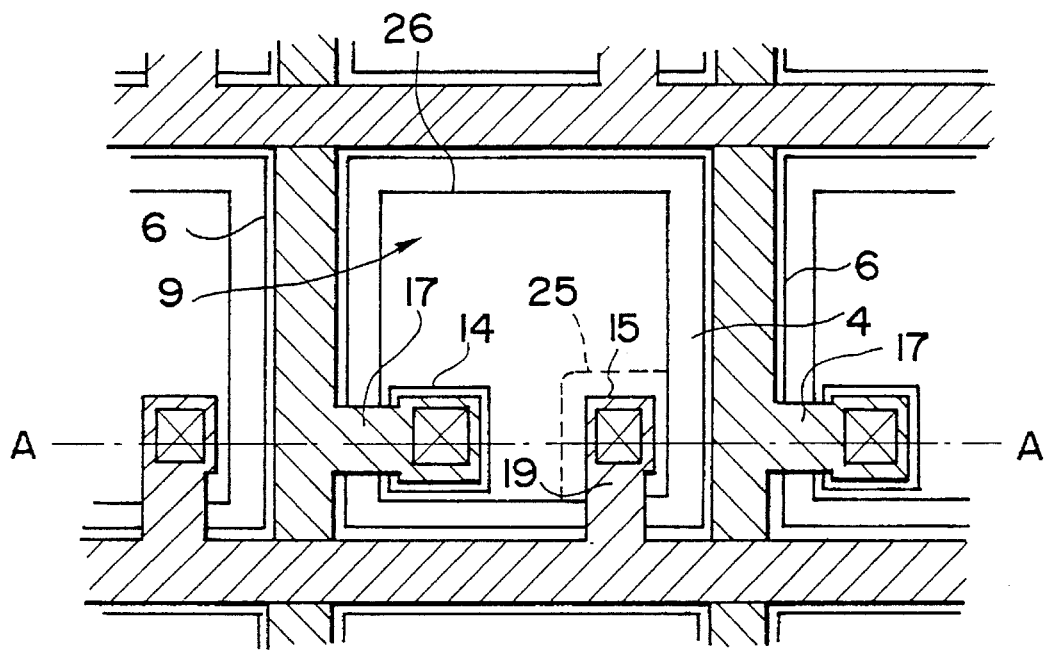
FIG. 2A is a schematic plan view of a preferred first embodiment of a photoelectric converting apparatus according to the present invention.
Figure 2B:
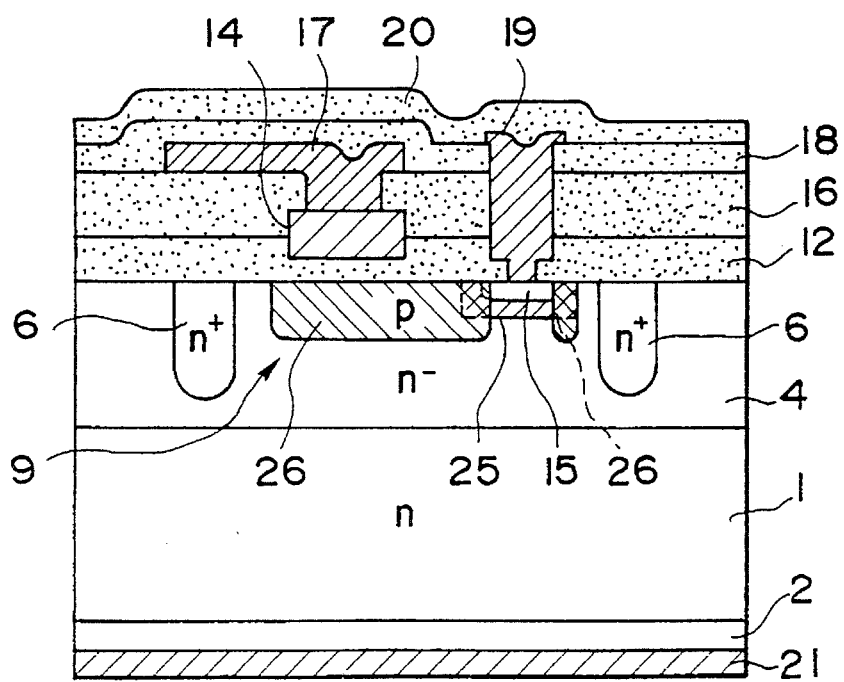
FIG. 2B is a schematic cross-sectional view of one of the cells in the apparatus of FIG. 2A taken along the line A—A in FIG. 2A.

FIG. 2A is a schematic plan view of the first embodiment of a photoelectric converting apparatus according to the invention. FIG. 2B is a cross-sectional view of one of the cells in the apparatus of FIG. 2A taken along the line A—A in FIG. 2A.

In the diagrams, the n$^-$ region 4 is formed on n silicon substrate 1 by an epitaxial growth method. In the n$^-$ region 4, respective semiconductor region as described below are formed. Photo-sensor cells which are electrically separated from one another by the n$^+$ element separating regions 6 are arranged in the n$^-$ region 4.

The p base region 9 and n$^+$ emitter region 15 of a bipolar transistor are formed on and over the n$^-$ region 4.

The p base region 9 in the embodiment consists of a portion 25 of a low p-type impurity concentration and a portion 26 of a high p type impurity concentration. Namely, the portion just under the n$^+$ emitter region 15 which contributes to the operation of the transistor is set to a low concentration. The other portions are set to high concentrations.

In this embodiment, it is preferable that the impurity concentration of the low-concentration portion 25 is set to a value within a range from $1\times10^{15}$ to $5\times10^{17}$ cm$^{-3}$ and that of the high-concentration portion 26 is set to a value within a range from $1\times10^{17}$ to $5\times10^{19}$ cm$^{-3}$.

The polysilicon region 14 faces the high-concentration portion 26 in the p base region 9 through the oxide film 12, whereby the polysilicon region 14, the oxide film 12 and the p base region 9 construct the capacitor $C_{ox}$ to control the base potential.

Further, the capacitor electrode 17 is formed on an insulative layer 16. The emitter electrode is formed on an insulative layer 18. A surface protective layer 20 is formed on the insulative layer 18 and emitter electrode 19. The n$^+$ region 2 of a high n-type impurity concentration is formed on the back surface of the substrate 1. The collector electrode 21 is formed on the back surface of the n$^+$ region 2.

By constructing the p base region 9 of the bipolar transistor, the surface of the base is set to a high concentration, the generation of the noise due to the surface current can be suppressed and the breakdown voltage can be improved. Further, since the concentration of the base is high, even if a positive voltage is applied to the polysilicon layer 14 in the reading operation, the reduction of the capacitance value of the $C_{ox}$ can be prevented.

On the other hand, since the impurity concentration of the portion which contributes to the transistor operation is maintained at a low value, the high $H_{fe}$ is derived.

As already been described above, the fundamental operation of the embodiment is as follows. First, the p base region 9 biased to a negative potential is set into the floating state and the holes among the electron-hole pairs generated by the light excitation are accumulated in the p base region 9 (accumulating operation).

Subsequently, the circuit between the emitter and the base is forwardly biased by applying a pulse of a positive voltage to the capacitor electrode 17. The accumulated voltage generated by the accumulated holes is read out to the emitter side in the floating state (reading operation).

On the other hand, the holes accumulated in the p base region 9 are eliminated by connecting the emitter electrode 19 to the ground and then applying a pulse of the positive voltage to the capacitor electrode 17 (refreshing operation).

Since the accumulated holes are eliminated, when the positive voltage pulse for refreshing trails, the p base region 9 is set to the initial state in which it is biased to the negative potential.

FIGS. 3A to 3D are step diagrams explaining an example of a method of manufacturing the p base region 9 and emitter region 15.

Figure 3A:
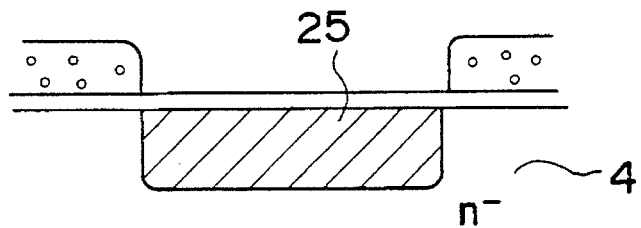
FIGS. 3A to 3D are step diagrams explaining an example of a method of manufacturing a p base region 9 and an emitter region 15.

First, as shown in FIG. 3A, a resist is patterned and the low-concentration portion 25 is formed on the n$^-$ region 4 by an ion implantation method or diffusion method or the like.

Figure 3B:
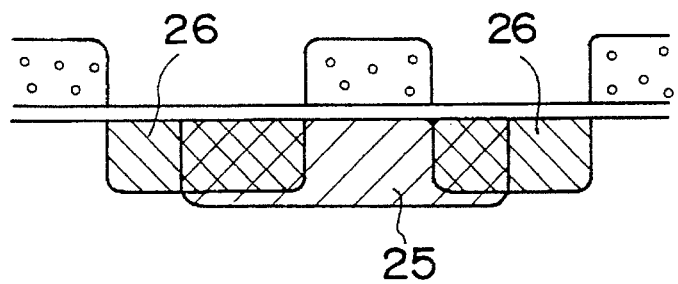

Subsequently, as shown in FIG. 3B, the emitter portion is similarly eliminated to thereby form the high-concentration portion 26. In this case, it is sufficient that the low- and high-concentration portions 25 and 26 overlap each other. The outer peripheries of the regions of both of the portions 25 and 26 may coincide, or the low-concentration region 25 may be located inside of the high-concentration portion 26. In the drawing, a zone in which the low-concentration region 25 and the high-concentration region are overlapped resulted in a high concentration region.

Figure 3C:
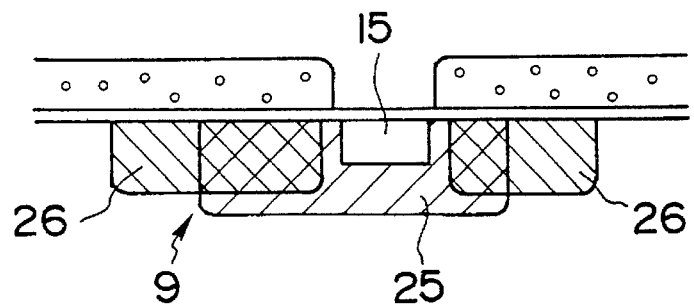

Next, as shown in FIG. 3C, after a resist was patterned, the n⁺ emitter region 15 is formed. At this time, the emitter region 15 and high-concentration portion 26 may be away from each other by a few μm as shown in the diagram, or they may be joined so as to overlap each other as shown in FIG. 2. Accordingly, in case of a few μm separation, the emitter region is arranged to be surrounded by low concentration region.

Actually it is desirable to overlap by a distance of 1 to 2 μm to suppress a variation in capacitance.

Figure 3D:
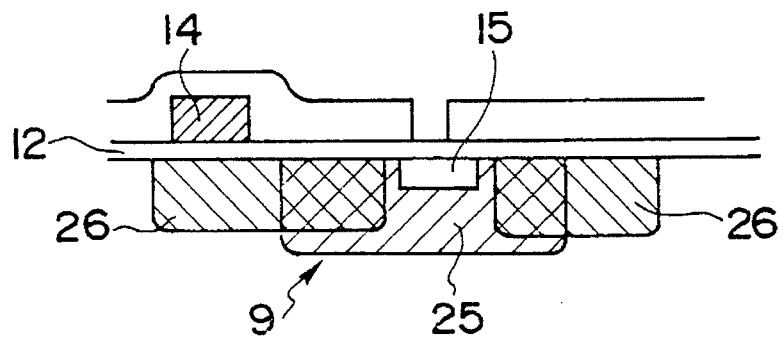

Subsequently, as shown in FIG. 3D, the polysilicon region 14 is formed so as to face the high-concentration portion 26 through the oxide film 12. After that, electrodes, insulative films among the layers, and the like are formed by ordinary processes.

Figure 4A:
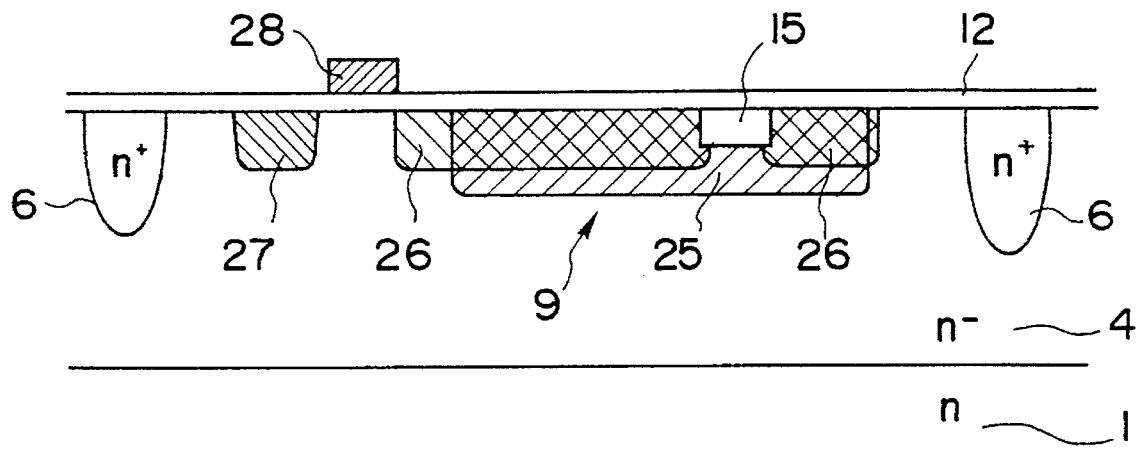
FIG. 4A is a schematic cross-sectional view of preferred second embodiment of the invention.
Figure 4B:
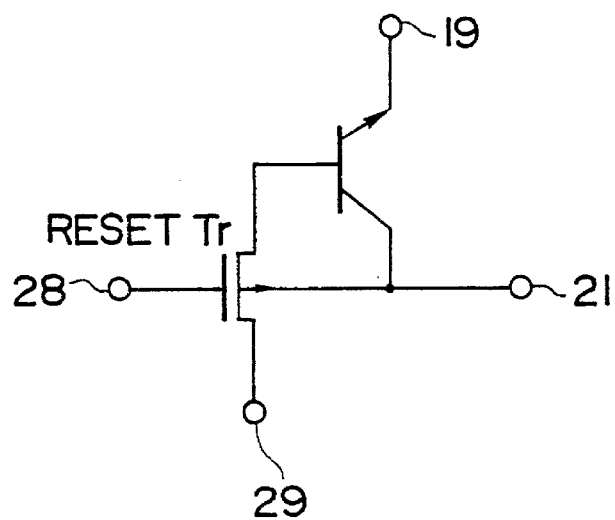
FIG. 4B is an equivalent circuit diagram of FIG. 4A.

FIG. 4A is a schematic cross sectional view of preferred second embodiment of the invention. FIG. 4B is an equivalent circuit diagram of FIG. 4A.

In the diagrams, a plurality of sensor cells are mutually separated from adjacent cells by the element separating regions 6.

Further, the p base region 9 is formed in n⁻ region 4. The n⁺ emitter region 15 is formed in the p base region 9. Thus, an npn type bipolar transistor is constructed. As mentioned above, the p base region 9 consists of the low- and high-concentration portions 25 and 26 and the n⁺ emitter region 15 is formed so as to overlap the high-concentration portion 26. The periphery of the p base region 9 excluding the portion (a bottom portion of p base region 9) just under the n⁺ emitter region 15 is surrounded by the high-concentration portion 26.

On the other hand, a p⁺ region 27 is formed in the n⁻ region 4 so as to be away from the high-concentration portion 26 of the p base region 9 by a predetermined distance. Moreover, a gate electrode 28 is formed over the n⁻ region 4 through the oxide film 12.

That is, in this embodiment, a resetting p channel MOS transistor (hereinafter, abbreviated to a "reset Tr") in which the high-concentration portion 26 of the base and the p⁺ region 27 are used as a source and a drain is constructed.

Although omitted in FIG. 4A, the emitter electrode 19, collector electrode 21, and an electrode 29 connected to the p⁺ region 27 are also formed.

The operation of the photoelectric converting cell in the embodiment will now be described.

As shown in FIG. 4B, the photoelectric converting cell is equivalent to a circuit in which the p base region 9 of the npn type bipolar transistor is connected to a drain of the reset Tr.

Fitst, in the accumulating operation, a potential $V_b$ of the p base region 9 is set into a floating state at an initial positive potential. The emitter region is set into a floating state at a zero potential. A positive voltage $V_{cc}$ is applied to the collector electrode 21. The gate electrode 28 of the reset Tr is set to a positive potential. The reset Tr is in the OFF state.

In this state, the light enters the light receiving portion and the carriers (holes in this case) corresponding to the incident light quantity are accumulated into the p base region 9.

At this time, since the p base region 9 is set to the initial positive potential, when the carriers are accumulated by the light excitation, the signal corresponding to the accumulated carriers is simultaneously read out to the emitter side in the floating state, so that a photoelectric conversion output is derived. That is, in this embodiment, the reading operation is executed simultaneously with the accumulating operation.

The operation to extinguish the carriers accumulated in the p base region 9 will now be described. It is now assumed that a predetermined voltage $V_{bg}$ is applied to the electrode 29.

First, when a pulse of a negative voltage is applied to the gate electrode 28 of the reset Tr, the reset Tr is turned on. Thus, the potential of the p base region 9 is set to the predetermined voltage $V_{bg}$ irrespective of the accumulated voltage, that is, independently of the illuminance of the incident light. The voltage $V_{bg}$ is set to a voltage which is enough higher than a base residual voltage $V_k$ which remains after completion of the transient refreshing operation of the bipolar transistor.

Subsequently, a voltage which is sufficiently lower than the voltage $V_{bg}$ is applied to the emitter electrode 19. Thus, the holes accumulated in the p base region 9 are recombined with the electrons which are injected from the n⁺ emitter region 15 to the p base region 9, so that the holes are extinguished. As already mentioned above, since the potential of the p base region 9 is set to the potential $V_{bg}$ which is enough higher than the residual potential $V_k$ irrespective of the accumulated potential, the potential of the p base region 9 is reset to a predetermined potential independently of the magnitude of the illuminance.

As mentioned above, in this embodiment, the non-linearity of the photoelectric converting characteristics in the low-illuminance state can be improved and an after-image phenomenon can be completely prevented. Also, similarly to the first embodiment, the transistor operation is executed in the low-concentration portion 25, so that the high $H_{fe}$ is obtained. Further, since the concentration on the base surface is high, the noise due to the surface current can be suppressed and the withstanding voltage can be improved.

What is claimed is:

1. A photoelectric converting apparatus comprising:

an n-type semiconductor substrate;

a p-type base region, said p-type base region comprising a low concentration region of low impurity concentration and a high concentration region of high impurity concentration, wherein carriers generated by photo-excitation are accumulated in said higher concentration region and wherein said p-type base region has no direct electrical connection to an external lead;

an n⁺ emitter region comprising an emitter electrode, said emitter region being formed by doping impurities into said substrate and said emitter region being in contact with said low concentration region, wherein a transistor configuration is defined by said p-type base region, said n⁺ emitter region and said substrate, wherein said low concentration region is provided between said n-type semiconductor substrate and said n⁺ emitter region, wherein a signal is read out from said emitter electrode in response to accumulated carriers when said emitter electrode is at a floating potential; and an n⁻ collector region having a lower impurity concentration than said n⁺ emitter region, wherein said p-type base region is disposed on said n⁻ collector region and at least a portion of said n⁺ emitter region is in contact with said high impurity concentration region of said p-type base region.

2. A photoelectric converting apparatus according to claim 1, wherein said n-type semiconductor substrate comprises an n-type silicon substrate, and wherein an n⁻ region is provided on said n-type silicon substrate.

3. A photoelectric converting apparatus according to claim 1, further comprising:

an element isolation region provided at a periphery of said n⁺ emitter region and said p-type base region for electrically isolating said n$^+$ emitter region and said p-type base region from other elements in said n-type semiconductor substrate.

4. A photoelectric converting apparatus according to claim 1, wherein said n$^+$ emitter region contacts said high impurity concentration region of said p-type base region at a side surface of said n$^+$ emitter region.

5. A photoelectric converting apparatus according to claim 1, wherein said n$^+$ emitter region is surrounded by said low impurity concentration region of said p-type base region.

6. A photoelectric converting apparatus according to claim 1, further comprising:

an insulating layer disposed opposing said base region: and a polysilicon region disposed on said insulating layer.

7. A photoelectric converting apparatus according to claim 1, further comprising:

a p$^+$ region arrange physically separated from said p-type base region in said n-type semiconductor substrate;

an insulating layer disposed on said p-type base region and said p$^+$ region; and an electrode disposed on said insulating layer.

8. A semiconductor apparatus comprising:

a photoelectric converting apparatus comprising:
 a first semiconductor region of a first conductivity type;
 a second semiconductor region of the first conductivity type having a higher impurity concentration than said first semiconductor region;
 a third semiconductor region of a second conductivity type opposite to the first conductivity type, operatively associated to said first and second semiconductor regions to define with said first and second semiconductor regions a transistor configuration, for accumulating photo-excited carriers in said third semiconductor region, said second semiconductor region being in contact with said third semiconductor region;
 a fourth semiconductor region of the second conductivity type provided between said first and second semiconductor regions, and doped with impurities having a concentration lower than that of said third semiconductor region;
 means for extracting directly from said third semiconductor region at a floating potential a signal representative of a number of carriers accumulated in said transistor configuration; and a MOS transistor having source and drain regions, wherein one of said source and drain regions comprises said second semiconductor region.

9. A semiconductor apparatus comprising:

a photoelectric converting apparatus comprising:
 an n-type semiconductor substrate;
 a p-type base region, said p-type base region comprising a low concentration region of low impurity concentration and a high concentration region of high impurity concentration, wherein carriers generated by photo-excitation are accumulated in said higher concentration region and wherein said p-type base region has no direct electrical connection to an external lead;
 an n$^+$ emitter region comprising an emitter electrode, said emitter region being formed by doping impurities into said substrate and said emitter region being in contact with said high concentration region, wherein a transistor configuration is defined by said p-type base region, said n$^+$ emitter region and said substrate, wherein said low concentration region is provided between said n-type semiconductor substrate and said n$^+$ emitter region, wherein a signal is read out from said emitter electrode in response to accumulated carriers when said emitter electrode is at a floating potential;
 an n$^-$ collector region having a lower impurity concentration than said n$^+$ emitter region, wherein said p-type base region is disposed on said n$^-$ collector region; and a MOS reset transistor having source and drain regions, wherein one of said source and drain regions comprises said p-type base region.

10. A semiconductor apparatus comprising:

a photoelectric converting apparatus comprising:
 a first semiconductor region of a first conductivity type;
 a second semiconductor region of the first conductivity type having a higher impurity concentration than said first semiconductor region;
 a third semiconductor region of a second conductivity type opposite to the first conductivity type, operatively associated to said first and second semiconductor regions to define with said first and second semiconductor regions a transistor configuration, for accumulating photo-excited carriers in said third semiconductor region, said second semiconductor region being in contact with said third semiconductor region;
 a fourth semiconductor region of the second conductivity type provided between said first and second semiconductor regions, and doped with impurities having a concentration lower than that of said third semiconductor region;
 means for extracting directly from said third semiconductor region at a floating potential a signal representative of a number of carriers accumulated in said transistor configuration; and a MOS reset transistor having source and drain regions, wherein one of said source and drain regions comprises said second semiconductor region.

11. A photoelectric converting apparatus comprising:

a first semiconductor region of a first conductivity type;

a second semiconductor region of the first conductivity type having a higher impurity concentration than said first semiconductor region;

a third semiconductor region of a second conductivity type opposite to the first conductivity type, operatively associated to said first and second semiconductor regions to define with said first and second semiconductor regions a transistor configuration, for accumulating photo-excited carriers in said third semiconductor region, said second semiconductor region being in contact with said third semiconductor region;

a fourth semiconductor region of the second conductivity type provided between said first and second semiconductor regions, and doped with impurities having a concentration lower than that of said third semiconductor region; and means for extracting directly from said third semiconductor region at a floating potential a signal representative of a number of carriers accumulated in said transistor configuration.

12. A photoelectric converting apparatus according to claim 11, wherein said first conductivity type is n-type.

13. A photoelectric converting apparatus according to claim 12, wherein said first semiconductor region comprises an n-type silicon substrate and an n⁻ region provided on said substrate.

14. A photoelectric converting apparatus according to claim 11, wherein at least a portion of said second semiconductor region is in contact with said third semiconductor region.

15. A photoelectric converting apparatus according to claim 14, wherein said second semiconductor region is in contact with said third semiconductor region at a side surface of said second semiconductor region.

16. A photoelectric converting apparatus according to claim 11, wherein said second semiconductor region is surrounded by said fourth semiconductor region.

17. A photoelectric converting apparatus according to claim 11, further comprising:

a conductive portion provided at a position opposite to said third semiconductor region.

18. A photoelectric converting apparatus according to claim 11, further comprising:

an insulating layer disposed opposite to said third semiconductor region; and a polysilicon region disposed on said insulating layer.

19. A photoelectric converting apparatus according to claim 11, further comprising:

a fifth semiconductor region of the second conductivity type provided within said first semiconductor region; and an insulating layer disposed on said first and fifth semiconductor regions; and an electrode disposed on said insulating layer.

20. A photoelectric converting apparatus according to claim 11, further comprising:

an element isolation region provided at a periphery of said second and third semiconductor regions for electrically isolating said first semiconductor region, said third semiconductor region and said fourth semiconductor region from other elements.

21. A photoelectric converting apparatus according to claim 20, wherein said element isolation region is of the first conductivity type and is doped with impurities at a concentration higher than that of said first semiconductor region.

22. A photoelectric converting apparatus according to claim 1, wherein the impurity concentration of said higher concentration region is in the range of $1 \times 10^{17}$ cm$^{-3}$ to $5 \times 10^{19}$ cm$^{-3}$.

23. A photoelectric converting apparatus according to claim 1, wherein the impurity concentration of said lower concentration region is in the range of $1 \times 10^{15}$ cm$^{-3}$ to $5 \times 10^{17}$ cm$^{-3}$.

24. A photoelectric converting apparatus according to claim 11, wherein the impurity concentration of said third semiconductor region is in the range of $1 \times 10^{17}$ cm$^{-3}$ to $5 \times 10^{19}$ cm$^{-3}$.

25. A photoelectric converting apparatus according to claim 11, wherein the impurity concentration of said fourth semiconductor region is in the range of $1 \times 10^{15}$ cm$^{-3}$ to $5 \times 10^{17}$ cm$^{-3}$.

\* \* \* \* \*

UNITED STATES PATENT AND TRADEMARK OFFICE
CERTIFICATE OF CORRECTION

PATENT NO. : 5,598,023

DATED : January 28, 1997

INVENTORS : SHIGEYUKI MATSUMOTO

It is certified that error appears in the above-identified patent and that said Letters Patent is hereby corrected as shown below:

COLUMN 1

Line 64, "the" should be deleted.

COLUMN 5

Line 16, "cross sectional" should read --cross-sectional--.

COLUMN 7

Line 19, "arrange" should read --arranged--.

UNITED STATES PATENT AND TRADEMARK OFFICE
CERTIFICATE OF CORRECTION

PATENT NO. : 5,598,023

DATED : January 28, 1997

INVENTORS : SHIGEYUKI MATSUMOTO

It is certified that error appears in the above-identified patent and that said Letters Patent is hereby corrected as shown below:

COLUMN 10

Line 8,   "elements" should read --elements written said first semiconductor region.--.

Signed and Sealed this

Twelfth Day of August, 1997

Attest:

BRUCE LEHMAN

Attesting Officer    Commissioner of Patents and Trademarks